United States Patent
Chen et al.

(10) Patent No.: US 10,222,442 B2
(45) Date of Patent: Mar. 5, 2019

(54) METHOD AND APPARATUS FOR SINGLE CARRIER WIDEBAND MAGNETIC RESONANCE IMAGING (MRI) DATA ACQUISITION

(71) Applicant: National Taiwan University, Taipei (TW)

(72) Inventors: Jyh-Horng Chen, Taipei (TW); Tzi-Dar Chiueh, Taipei (TW); Edzer Lienson Wu, Taipei (TW); Yun-An Huang, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 1297 days.

(21) Appl. No.: 14/255,672

(22) Filed: Apr. 17, 2014

(65) Prior Publication Data

US 2014/0312899 A1    Oct. 23, 2014

Related U.S. Application Data

(60) Provisional application No. 61/813,298, filed on Apr. 18, 2013.

(51) Int. Cl.
*G01R 33/561* (2006.01)
*G01R 33/48* (2006.01)
*G01R 33/565* (2006.01)

(52) U.S. Cl.
CPC ........ *G01R 33/561* (2013.01); *G01R 33/4818* (2013.01); *G01R 33/4824* (2013.01); *G01R 33/56545* (2013.01)

(58) Field of Classification Search
CPC .............. G01R 33/561; G01R 33/4818; G01R 33/4824; G01R 33/56545
See application file for complete search history.

(56) References Cited

U.S. PATENT DOCUMENTS

| | | | | |
|---|---|---|---|---|
| 7,701,214 B2* | 4/2010 | Kurokawa | ....... | G01R 33/56375 324/318 |
| 2009/0219020 A1* | 9/2009 | Kurokawa | ....... | G01R 33/56375 324/309 |
| 2014/0070809 A1* | 3/2014 | Imamura | ................ | G01R 33/36 324/319 |

* cited by examiner

*Primary Examiner* — Dixomara Vargas
(74) *Attorney, Agent, or Firm* — Muncy, Geissler, Olds & Lowe, P.C.

(57) ABSTRACT

A method and apparatus for single carrier wideband magnetic resonance imaging (MRI) data acquisition are provided. The method includes the following steps: exciting a slice or slab with the use of RF pulse and a slice/slab selection gradient; applying a phase encoding gradient along a phase encoding direction and reducing a FOV along the phase encoding direction by a factor of W through k-space subsampling; applying a frequency encoding gradient along a frequency encoding direction and increasing a FOV along the frequency encoding direction by a factor of $W_f$; and applying a separation gradient along the phase encoding direction during the frequency encoding duration and k-space data acquisition.

16 Claims, 11 Drawing Sheets

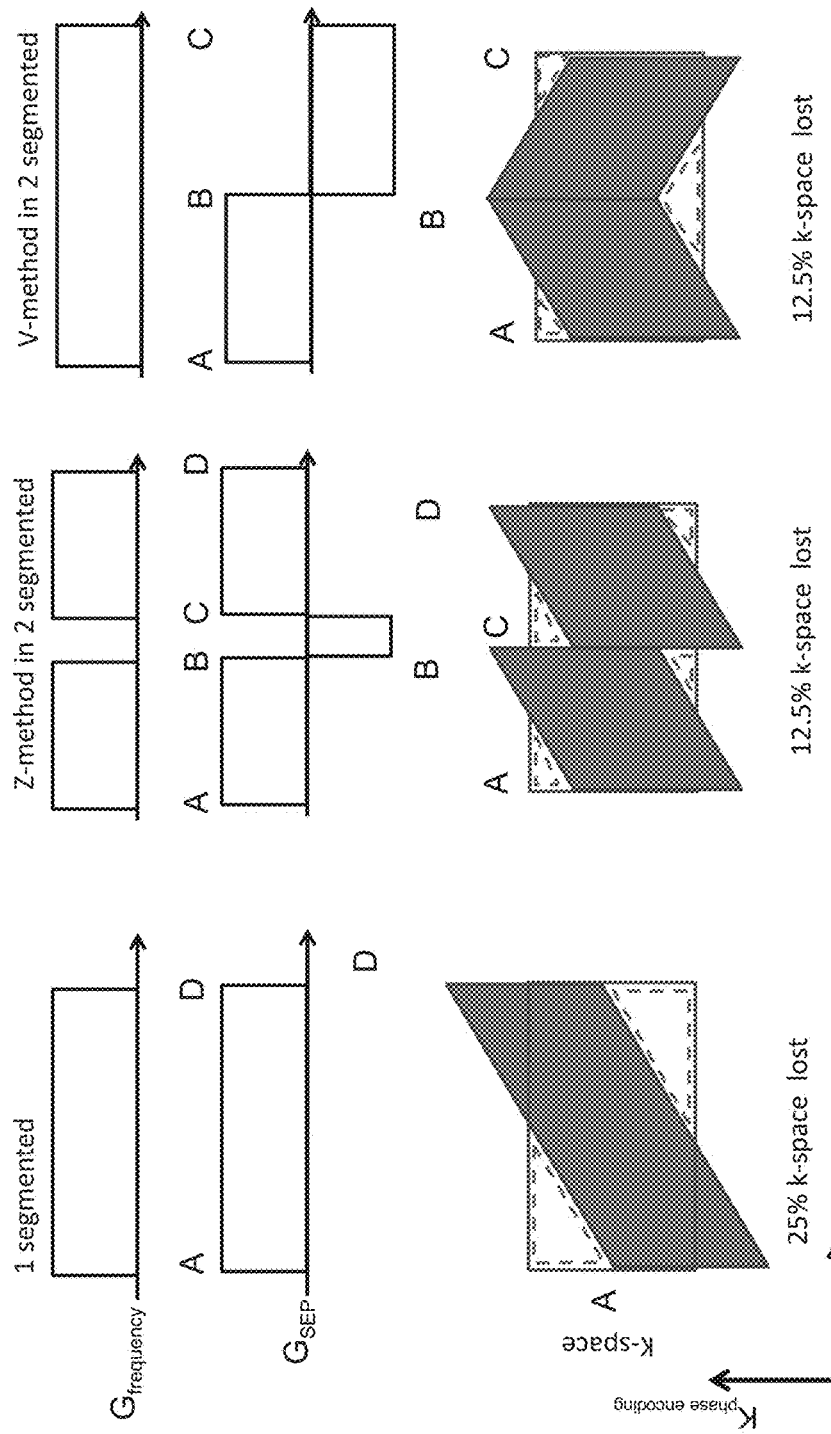

METHOD AND APPARATUS FOR SINGLE CARRIER WIDEBAND MAGNETIC RESONANCE IMAGING (MRI) DATA ACQUISITION

BACKGROUND OF THE INVENTION

1. Field of the Invention

The present disclosure relates to Wideband Magnetic Resonance Imaging (MRI). More particularly, the present disclosure relates to Single Carrier Wideband MRI and blur mitigation of the image.

2. Description of Related Art

Magnetic resonance imaging (MRI) is one of the most important diagnosis tools because of its non-invasiveness and excellent contrast between soft tissues; however, it is also one of the clinical resources in scarcity. To make MRI available to more people in need and to lower its cost at the same time, the demand for speeding up the imaging process or increasing the spatio-temporal resolution is never stopped.

One category of the fast MRI method is parallel MRI, which uses multiple receiving coils; each of the coils covers part of the field of view (FOV), and different part of the FOV can be imaged in a parallel manner; the aliasing artifact resulted from duplicate coverage of multiple coils is eliminated during the reconstruction process. The arrangement of the multiple coils is crucial in the parallel MRI, because it affects the aliasing artifact and the sensitivity of the coil array directly. Several parallel MRI techniques, such as SENSE (Sensitivity Encoding) and GRAPPA (Generalized Auto-calibrating Partially Parallel Acquisition) have been developed.

Another fast MRI technique called wideband MRI utilizes the idea of frequency multiplexing to accelerate the scan time and is highly compatible to others sequences (fast spin echo, gradient echo etc.) and accelerate methods (parallel imaging etc.). The very same concept can either be applied to acquire images of multiple locations at the same time or to simultaneously acquire different parts of one excited region, so called single carrier wideband acceleration. In the present application, the single carrier wideband MRI technique is disclosed, and a technique to mitigate the blur induced is also broached.

SUMMARY OF THE INVENTION

The present application discloses a method for single carrier wideband magnetic resonance imaging (MRI) data acquisition, comprising the following steps: exciting a slice or slab with the use of RF pulse and a slice/slab selection gradient; applying a phase encoding gradient along a phase encoding direction and reducing a field of view (FOV) along the phase encoding direction by a factor of W through k-space subsampling; applying a frequency encoding gradient along a frequency encoding direction and increasing a FOV along the frequency encoding direction by a factor of Wf; and applying a separation gradient along the phase encoding direction during the frequency encoding duration and k-space data acquisition. The factor of W could be an integer or a positive number comprising a decimal. And the factor of $W_f$ comprises positive number, integer and decimal.

In an ordinary MRI data acquisition procedure, the phase encoding steps are rather time-consuming, because in the beginning of each phase encoding step, the phase encoding gradient needs to be excited. By reducing the FOV and encoding steps along the phase encoding direction, and increasing the FOV and encoding steps along the frequency encoding direction, the resolution is maintained while the total scan time can be reduced. The originally aliased image can be separated by a separation gradient and the enlarged FOV along frequency encoding. The separation gradient is turned on during frequency encoding along the direction the phase encoding is reduced.

The concept here is to divide the single slice/slab into several blocks with a reduced FOV, and to acquire the k-space data of each of the blocks at the same time. FIG. 1 illustrates how the above-mentioned single carrier wideband MRI technique acquires different parts (blocks) of the original FOV. FIG. 1a is the imaging target; the wideband factor W which denotes the acceleration rate of wideband MRI is 2 in this example. In FIG. 1a, both of block 1 and block 2 have half of the FOV in the phase encoding direction. FOV of each $$\text{block} = \left[ FOV_{fe}, \frac{FOV_{pe}}{W} \right],$$

where $FOV_{fe}$ and $FOV_{pe}$ are the FOV of the frequency encoding and phase encoding respectively; from the above equation, a wideband factor W equal to 2 implies the same resolution can be achieved with half of scan time. When the factor of W comprises decimal, the factor of $W_f$ is a value of W rounding up to avoid the overlap of blocks.

A separation gradient illustrated in FIG. 2b is added along the phase encoding direction during the frequency encoding duration. The strength of separation gradient should satisfy the formula in isotropic voxel size:

$$|G_{sep}| \geq W \times \frac{FOV_{fe}}{FOV_{pe}}.$$

The actual image acquired is illustrated in FIG. 1b; the shear effect induced by the separation gradient can be observed. Because the image shown in FIG. 1b is free from aliasing artifact, each of block 1 and block 2 in FIG. 1a can be recovered; the recovered blocks are given in FIG. 1c. From this example, it can be observed that the amount of information required for a single image with same resolution is unchanged while the separation gradient conveys the time consuming phase encoding steps onto the frequency encoding process. This technique can be applied to either 2D or 3D MRI. In 2D imaging, there is only one phase encoding direction, while in 3D imaging, it is possible that there are two phase encoding directions. In 3D imaging cases, the separation gradient could be added in either one of the phase encoding directions or both of the phase encoding directions.

However, such technique causes high frequency k-space data loss that blurs the image, which can be observed if the high frequency part in A1 of FIG. 1c is compared with that in FIG. 1a. FIG. 3 explains the origin of this problem. In FIG. 3, the rectangular region represents an ordinary Cartesian k-space trajectory, and this region comprises the original k-space data (without wideband acceleration). However, with wideband acceleration and the separation gradient added, extra phases accumulate in the k-space data acquired, and the k-space data acquired no longer follows the rectangular trajectory. The k-space trajectory is sheared (the shaded region in FIG. 3) due to this phase accumulation phenomenon. On the basis that the quantity of the total information is unchanged, as it can be observed in FIG. 3, the high frequency k-space data on the upper-right and lower-left corners are lost. This loss of data causes blur in the reconstructed image. To address this problem, the loss should be reduced then the k-space trajectory can be 'refocused' along the frequency encoding direction.

To reduce the high frequency k-space data loss, a blur mitigation method by modifying the sequence is broached here. The concept is to modify the separation gradient sequence, or to modify both the separation gradient sequence and the frequency encoding sequence. The key point is the modification resets the phase accumulation or reverses the direction of the phase accumulation during some time of the data acquisition; therefore, the data loss can be minimized. FIG. 4b and FIG. 4c give two example of this modification in the case of separation gradient ratio ($G_{sep}$) which is 1. In FIG. 4b, a reset gradient (a reversed field in the separation gradient) is applied in the middle of the data acquisition procedure. It can be observed that the phase is reset, and the resulting k-space trajectory is in a zigzag form (Z-method) and covers more of the original k-space data than the k-space trajectory without the refocusing modification (FIG. 4a). In FIG. 4c, the direction of the separation gradient is reversed in the middle of the data acquisition procedure which reverses the phase accumulation direction, and the resulting k-space trajectory is in an inverted 'V' form (V-method) and again covers more of the original k-space data than the k-space trajectory without the refocusing modification (FIG. 4a). It is obvious that the modification illustrated in FIG. 4c could also result a k-space trajectory in a 'V' form if the beginning phase accumulation direction is reversed. The experimental results of k-space loss caused by different type of trajectory and numbers of segments (S) are shown in following tables:

| FIG. | Number of segment (S) | Type of trajectory | k-space loss |
| --- | --- | --- | --- |
| FIG. 4A | S = 1 | ordinary Cartesian method | 25% |
| FIG. 4B | S = 2 | Z-method | 12.5% |
| FIG. 4C | S = 2 | V-method | 12.5% |
| FIG. 4D | S = 3 | Z-method | 8.3% |
| FIG. 4E | S = 4 | V-method | 8.3% |
| FIG. 4F | S = 5 | Z-method | 5% |
| FIG. 4G | S = 5 | V-method | 5% |

In additional, the trajectory of segments [A, B], [B, C], [C, D], . . . etc could be a straight line, curve, or combination thereof. And the line trajectory of segments comprises a plurality of slopes or the same slope.

This sequence modification divides the separation gradient (or both the separation gradient and the frequency encoding gradient) into several segments; theoretically, increasing the number of the segments could suppress the data loss further at the cost of system complexity. However, the number of the segments still depends on the actual geometry of the imaging target and the Wideband factor W. FIGS. 5a, 5b, and 5c illustrate the value of k-space loss caused by the different Voxel size along phase encoding direction and frequency encoding direction in the case of separation gradient ratio ($G_{sep}$) which is 1. The experimental results of k-space loss caused by different ratio are shown in following tables:

| FIG. | Ratio | k-space loss |
| --- | --- | --- |
| FIG. 5a | Voxel Size$_{freq}$ = Voxel Size$_{phase}$ | 25% |
| FIG. 5b | ½ × Voxel Size$_{freq}$ = Voxel Size$_{phase}$ | 12.5% |
| FIG. 5c | Voxel Size$_{freq}$ = ½ × Voxel Size$_{phase}$ | 50% |

FIG. 6 illustrates an apparatus for single carrier wideband magnetic resonance imaging (MRI) data acquisition which implements the aforementioned single carrier wideband MRI as well as the blur mitigation technique. The apparatus comprises a sequence controller 51; a RF excitation module 52 controlled by the sequence controller 51 and generating a RF pulse to excite a slice or slab; and a gradient output module 55 including a gradient controller 53 and gradient coils 54 and this module is controlled by the sequence controller 51 and outputting magnetic field gradients along a plurality of different directions, the magnetic field gradients comprising: a slice/slab selection gradient; a phase encoding gradient along a phase encoding direction and with a reduced field of view (FOV) along the phase encoding direction by a factor of W; a frequency encoding gradient along a frequency encoding direction and with an increased FOV along the frequency encoding direction by a factor of $W_f$; and a separation gradient along the phase encoding direction during the frequency encoding duration and k-space data acquisition.

BRIEF DESCRIPTION OF THE DRAWINGS

FIG. 1a is the original image (target); FIG. 1b is the actual image acquired by single carrier wideband MRI technique with a wideband factor of 2; FIG. 1c is the reconstructed image with the shear effect corrected.

FIGS. 4a-4g give examples of the blur mitigation technique. FIG. 4a gives the spatial encoding sequence without blur mitigation and the corresponding k-space data trajectory; FIGS. 4b, 4d and 4f gives the spatial encoding sequence with blur mitigation which resets the phase accumulated; FIGS. 4c, 4e and 4g gives the spatial encoding sequence with blur mitigation which reverses the direction of the phase accumulation.

FIG. 7a is the reconstructed image from standard gradient echo (without acceleration). FIG. 7b is the reconstructed image from single carrier wideband MRI with W=2 acceleration. FIG. 7c is the reconstructed image from single carrier wideband MRI with W=2 acceleration and blur mitigation applied.

DETAILED DESCRIPTION OF THE PREFERRED EMBODIMENT

Figures 1A, 1B, 1C:
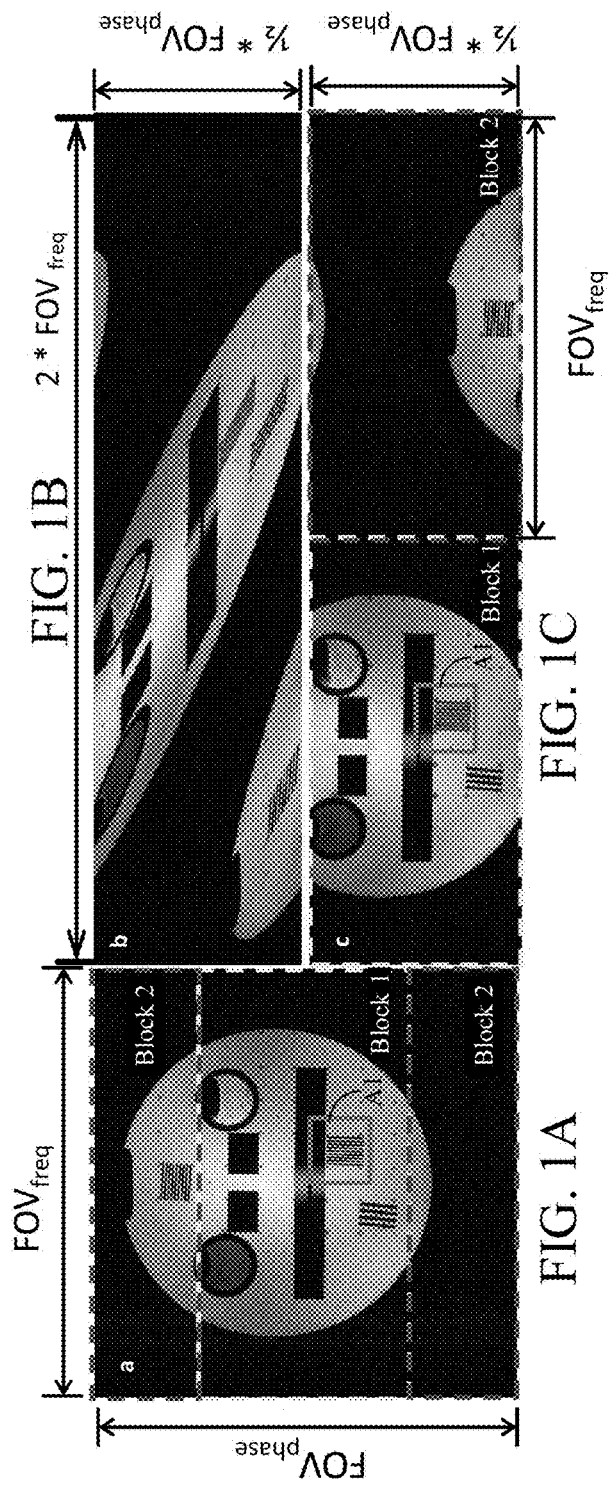
FIGS. 1a-1c give an example which demonstrates the imaging process and the effect of the single carrier wideband MRI technique.
Figure 2A:
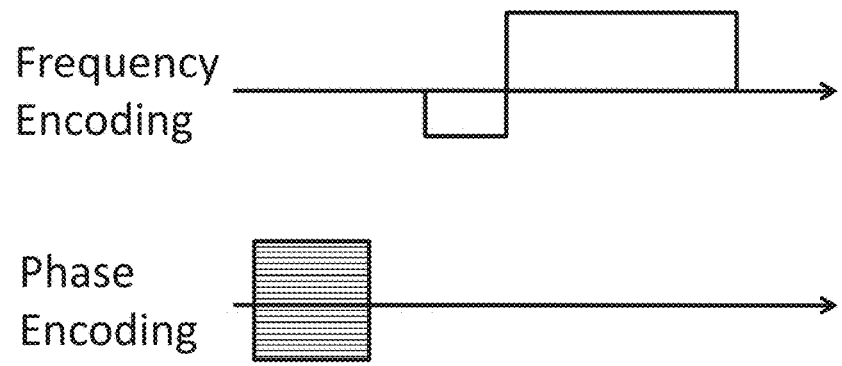
FIG. 2a illustrates the spatial encoding process of an ordinary 2D MRI.
Figure 2B:
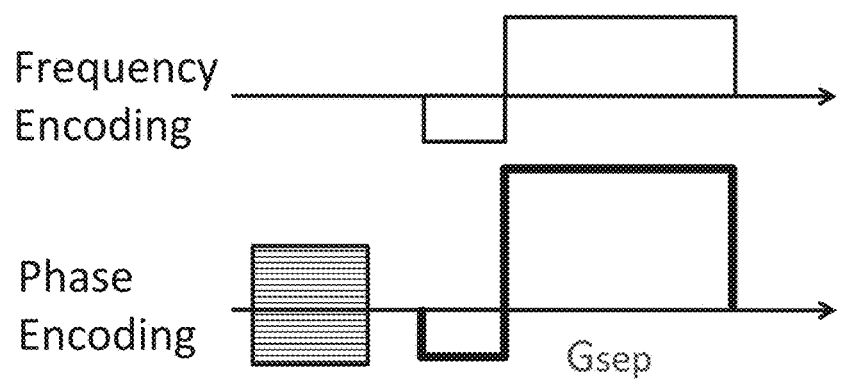
FIG. 2b illustrates the spatial encoding process of a 2D MRI with single carrier wideband MRI acceleration technique; a separation gradient is added along the phase encoding direction.
Figure 3:
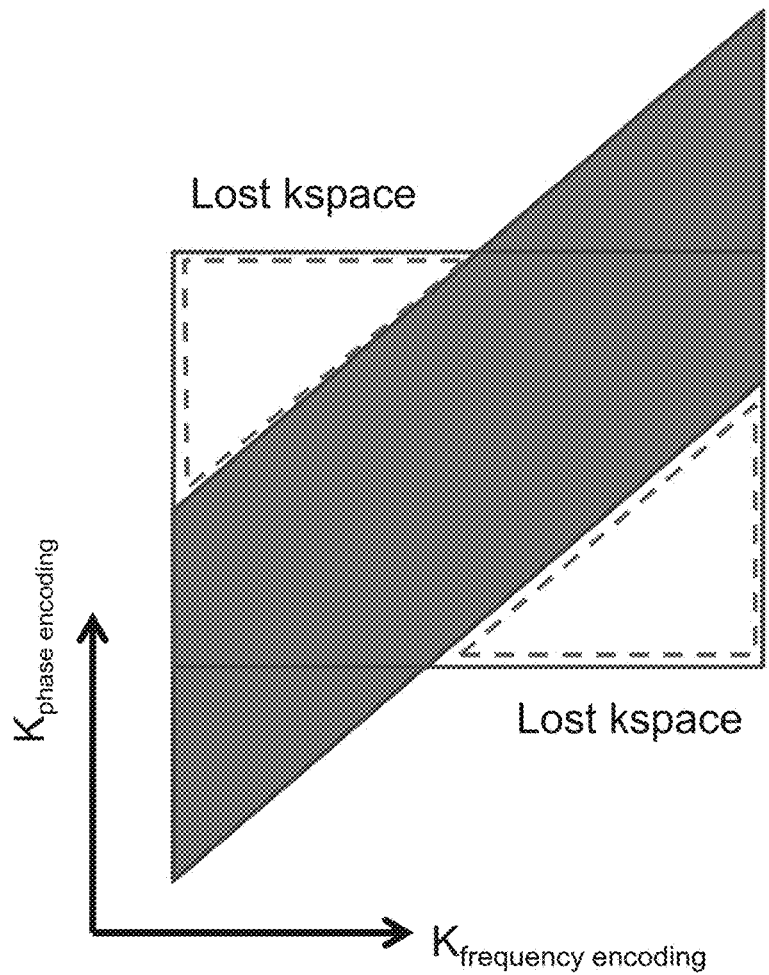
FIG. 3 compares an ordinary Cartesian k-space trajectory with the k-space trajectory with single carrier wideband MRI acceleration applied to explain the k-space data loss and origin of the blur in the reconstructed image.
Figures 4D, 4E, 4F, 4G:
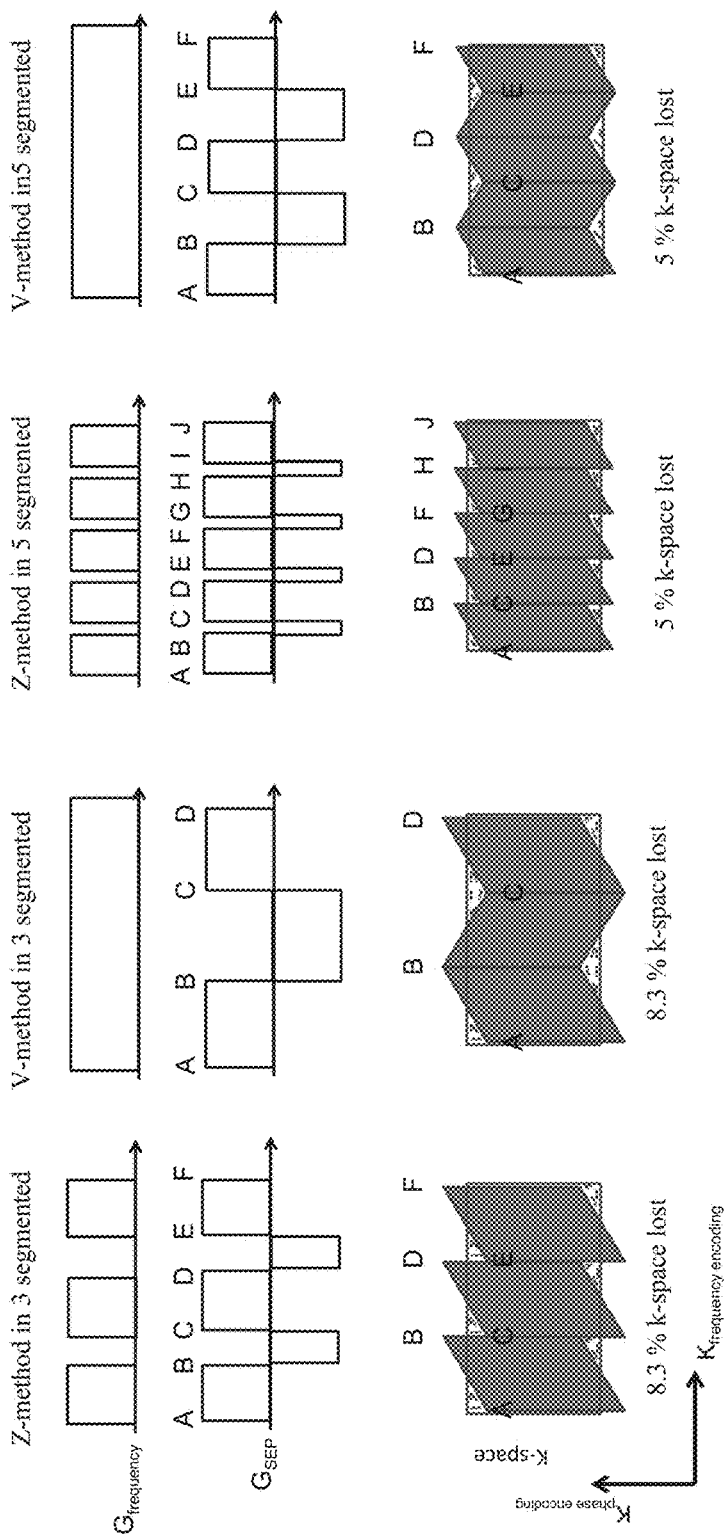
Figure 5A:
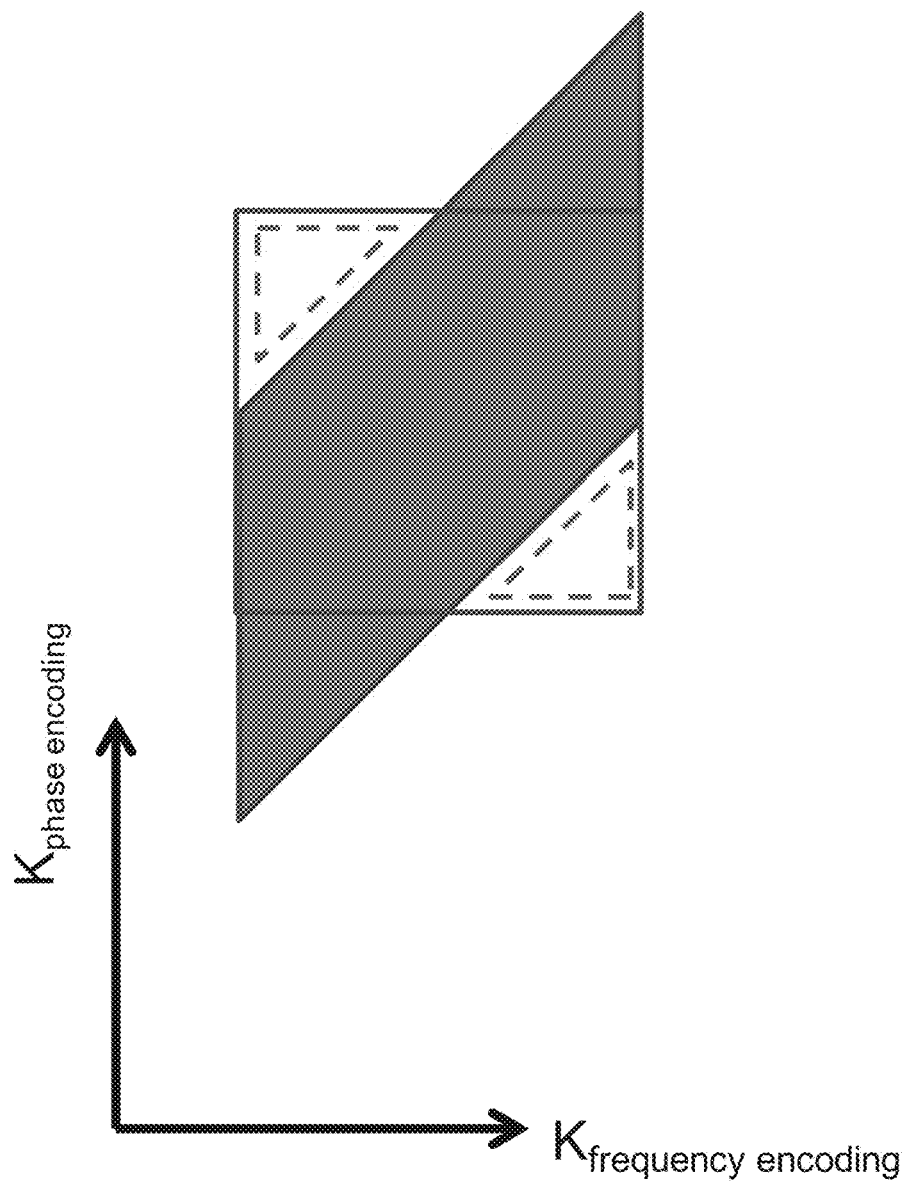
FIGS. 5a, 5b, and 5c give a value of k-space loss cause by the ratio between the Voxel Size$_{phase}$ and Voxel Size$_{freq}$.
Figure 5B:
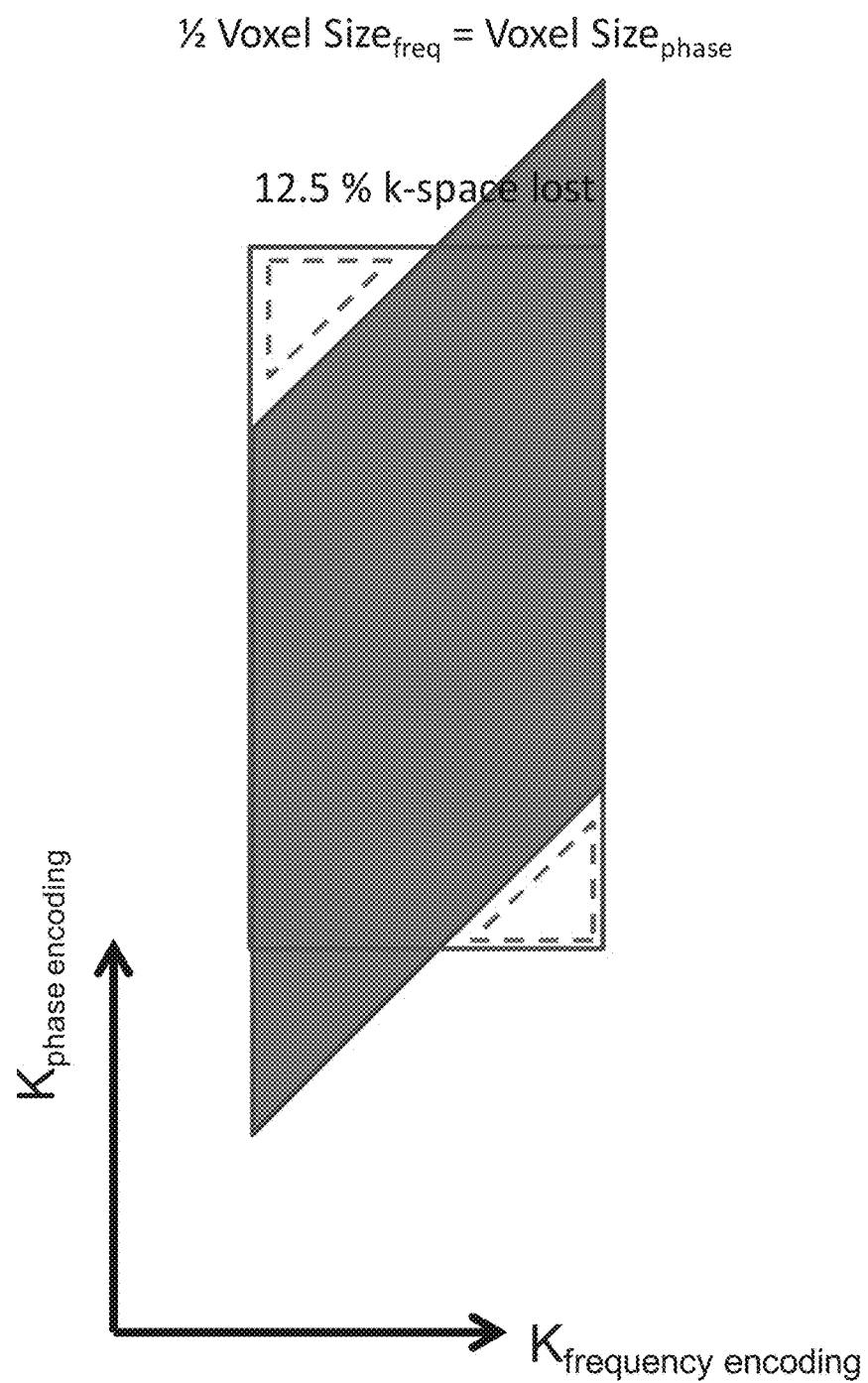
Figure 5C:
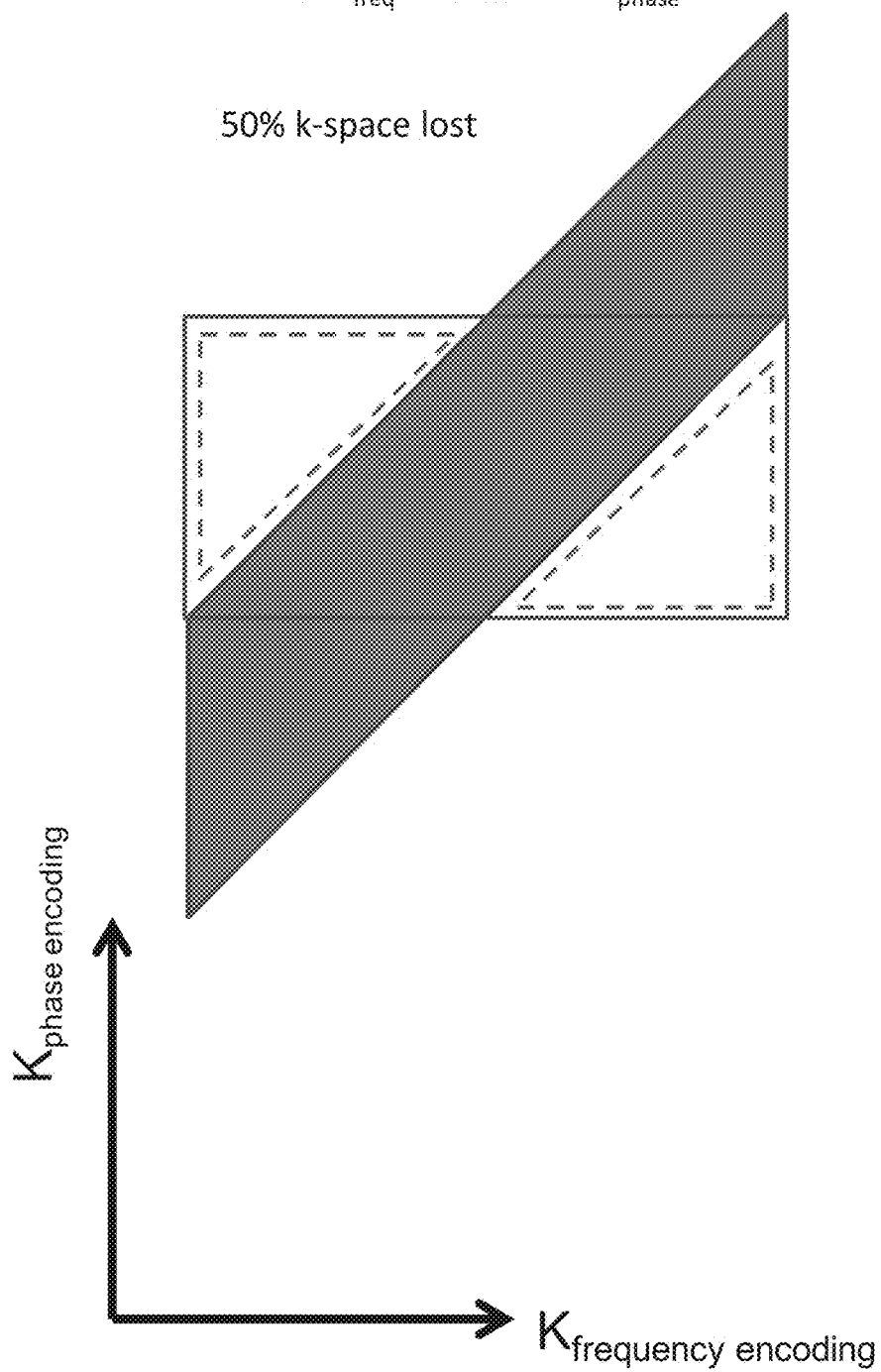
Figure 6:
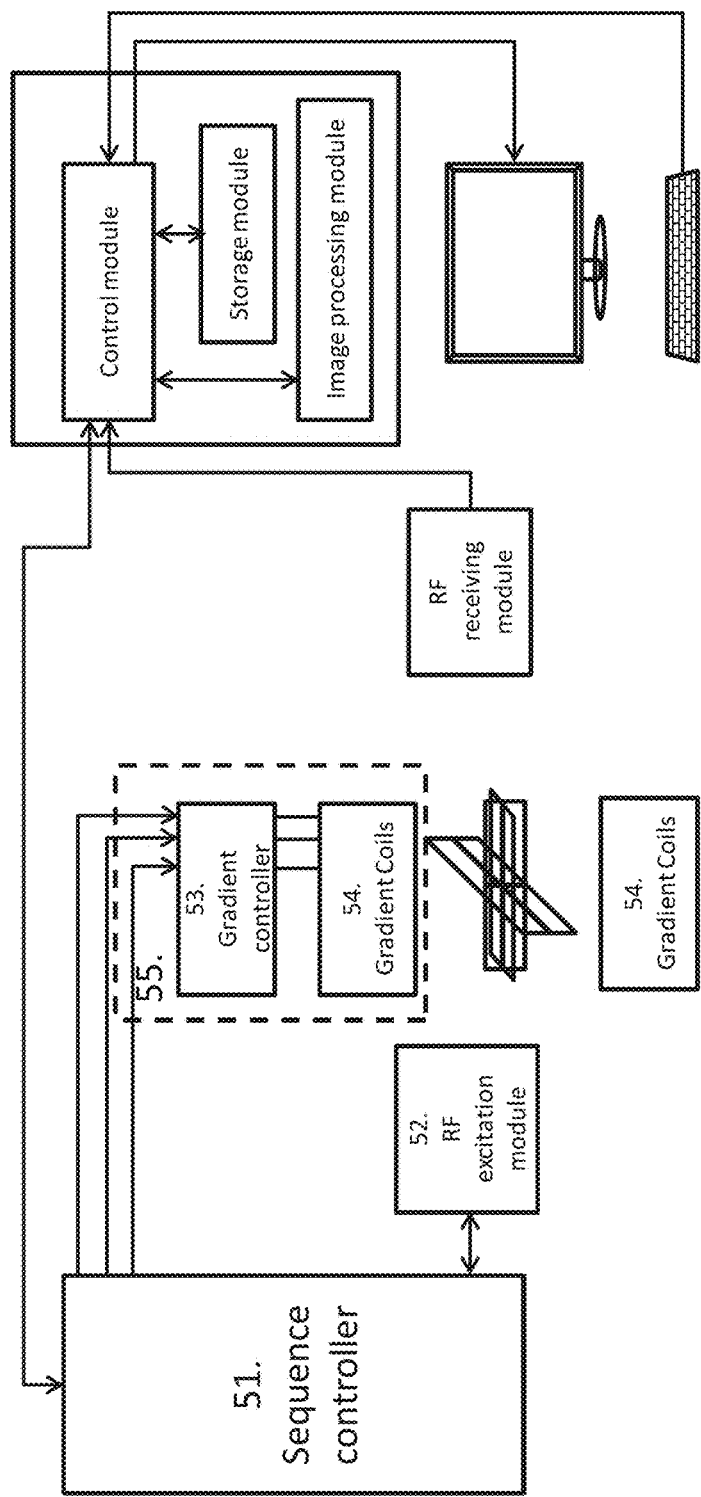
FIG. 6 illustrates an apparatus for single carrier wideband magnetic resonance imaging (MRI) data acquisition.

To demonstrate the single carrier wideband MRI and the blur mitigation technique further, three scan protocols are compared, including a) standard gradient echo, b) single carrier wideband MRI with W=2 acceleration, and c) Single carrier Wideband MRI with W=2 acceleration and blur mitigation applied. All the images are taken on a 3T Bruker MRI/MRS system with quadrature head coils. The gradient echo sequence scan covers a FOV of 25.6×25.6 cm; matrix size is 256×256; resolution is 1 mm$^2$; thickness is 4 mm; and TR/TE is 70 ms/10 ms. The scan time using wideband MRI technique is 8 s, which reduces the original scan time by a factor of 2. The contrast of features with 1 mm high resolution (as the region indicated by the box in FIG. 1a) is used to examine the blurring effect.

Figures 7A, 7B, 7C:
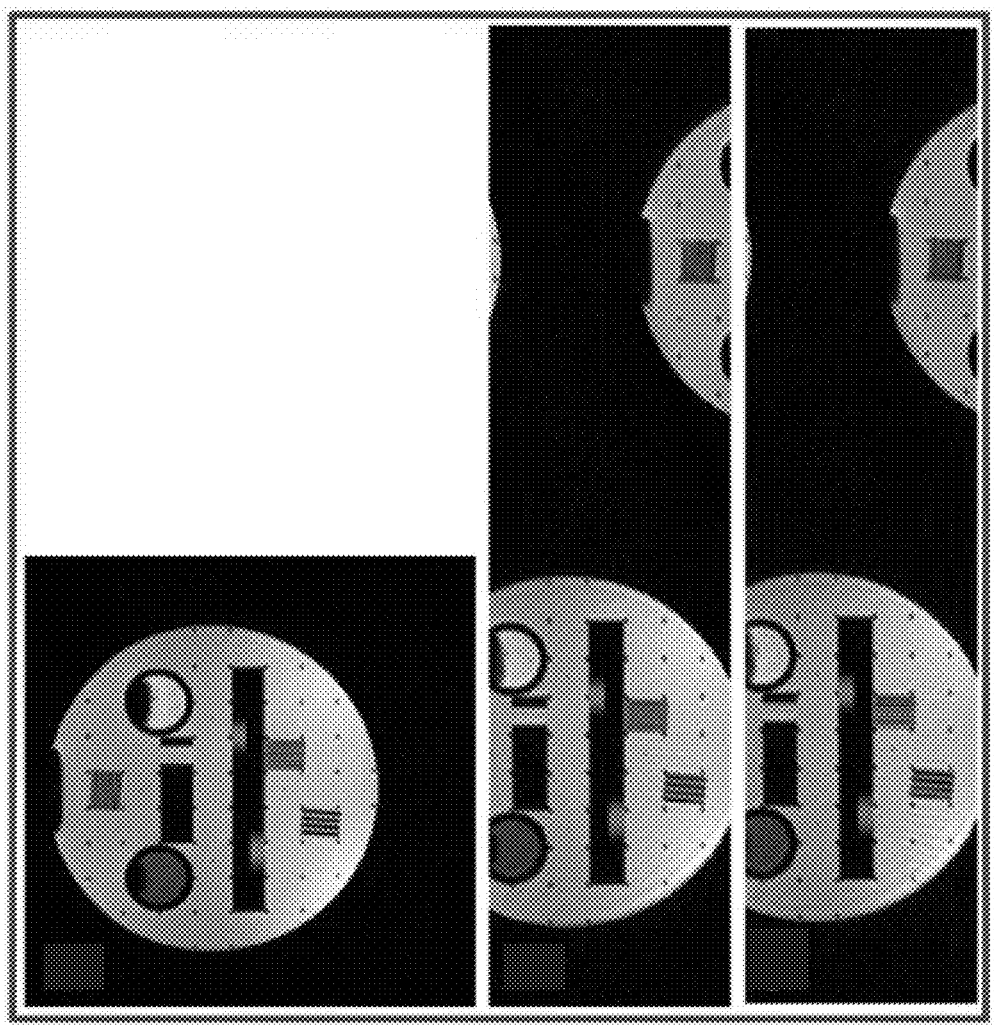
FIG. 7a, FIG. 7b, and FIG. 7c give an example which demonstrates the effect of the single carrier wideband MRI as well as the blur mitigation technique.
Figure 8A:
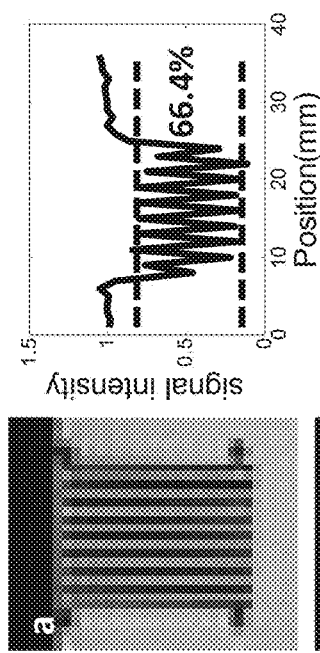
FIG. 8a, FIG. 8b, and FIG. 8c give the image contrast of the feature with 1 mm high resolution in FIG. 7a, FIG. 7b, and FIG. 7c respectively.
Figure 8B:
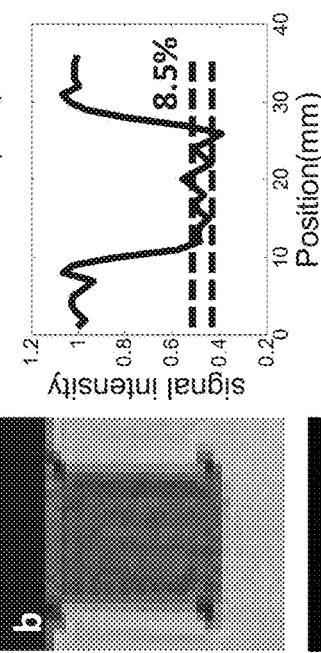
Figure 8C:
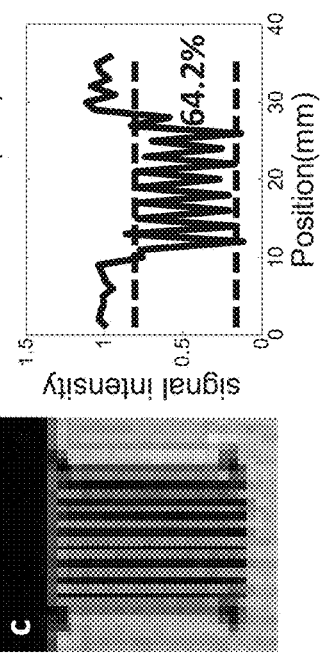

FIG. 7a, FIG. 7b, and FIG. 7c show the images acquired by a) standard gradient echo, b) W=2 single carrier acceleration wideband MRI, and c) W=2 single carrier acceleration wideband MRI with blur mitigation. The scan time using wideband MRI technique is 8 s, which reduces the standard gradient echo scan time by a factor of 2. The image contrast of features with 1 mm high resolution from each protocol is used to examine the blurring effect, and the results are shown in FIG. 8a, FIG. 8b, and FIG. 8c. The left row demonstrates image of high resolution structure. The right row demonstrates the profile of the high resolution structure. The x axis of right row of FIGS. 8a, 8b, and 8c are the position in the image of high resolution structure, and the y axis of right row of FIG. 8a, FIG. 8b, and FIG. 8c is the signal intensity of the high resolution structure image. The contrast of high resolution structure is 66.4%, 8.5% and 64.2%. In standard gradient echo, SCWB without blur mitigation and SCWB with blur mitigation, respectively.

The results from the standard gradient echo and the single carrier wideband MRI with blur mitigation have shown a peak-to-valley contrast about 64%~66% (shown in FIG. 8a), while the single carrier wideband MRI without blur mitigation fails to display the high resolution features (shown in FIG. 8b), which gives a merely 8.5% peak-to-valley contrast. The results demonstrate the image characteristics of single carrier wideband MRI technique and the blur mitigation (shown in FIG. 8c), wherein the blur mitigation has improved the high resolution contrast significantly. To sum up, single carrier wideband MRI technique can reduce the scan time and speed up the data acquisition; however, a simple separation gradient sequence results k-space data loss; this loss depends on the actual aspect ratio of the imaging target and the wideband factor W and could blur the reconstructed image to some extent. With the blur mitigation technique broached, this artifact can be addressed. Consequently, single carrier wideband MRI with blur mitigation can provide fast and high spatial resolution magnetic resonance images with image quality comparable to standard sequences, which is valuable in clinical studies.

What is claimed is:

1. A method for single carrier wideband magnetic resonance imaging (MRI) data acquisition, using a sequence controller to execute the following steps, comprising:
exciting a slice or slab with the use of RF pulse and a slice/slab selection gradient by a RF excitation module;
applying a phase encoding gradient along a phase encoding direction and reducing a field of view (FOV) along the phase encoding direction by a factor of W, and through a k-space subsampling by a gradient output module;
applying a frequency encoding gradient along a frequency encoding direction and increasing a FOV along the frequency encoding direction by a factor of $W_f$ and the gradient output module;
applying a separation gradient which comprises a plurality of segments along the phase encoding direction during the frequency encoding duration and the k-space data acquisition by the gradient output module; and
reconstructing an image through the k-space data by an image processing module,
wherein, the ratio of the separation gradient satisfying the formula in isotropic voxel size:

$$|G_{sep}| \geq W \times \frac{FOV_{fe}}{FOV_{pe}},$$

where $FOV_{fe}$ represented the FOV of the frequency encoding, $FOV_{Pe}$ represented the FOV of the phase encoding, and $G_{sep}$ represented the separation gradient.

2. The method of claim 1, wherein the factor of W comprises decimal fraction.

3. The method of claim 1, wherein the factor of $W_f$ comprises positive number.

4. The method of claim 1, wherein when the factor of W comprises a decimal, $W_f$ is a value of W rounding up.

5. The method of claim 1, wherein the plurality of segments comprise a plurality of slopes or a same slope.

6. The method of claim 1, wherein the frequency encoding gradient comprises a plurality of segments.

7. The method of claim 5, wherein the k-space data acquired have a trajectory in a zigzag form.

8. The method of claim 5, wherein the k-space data acquired have a trajectory in a 'V' or inverted 'V' than.

9. An apparatus for single carrier wideband magnetic resonance imaging (MRI) data acquisition, comprising:
a sequence controller;
an RF excitation module controlled by the sequence controller and generating an RF pulse to excite a slice or slab; and
a gradient output module controlled by the sequence controller and outputting magnetic field gradients along a plurality of different directions, the magnetic field gradients comprising:
a slice/slab selection gradient;
a phase encoding gradient along a phase encoding direction and with a reduced field of view (FOV) along the phase encoding direction by a factor of W;
a frequency encoding gradient along a frequency encoding direction and with an increased FOV along the frequency encoding direction by a factor of $W_f$;
a separation gradient which comprises a plurality of segments along the phase encoding direction during the frequency encoding duration and k-space data acquisition; and
an image processing module connected with the gradient output module to acquire the k-space data and reconstruct an image, and
wherein, the ratio of the separation gradient satisfying the formula in isotropic voxel size:

$$|G_{sep}| \geq W \times \frac{FOV_{fe}}{FOV_{pe}},$$

where $FOV_{fe}$ represented the FOV of the frequency encoding, $FOV_{Pe}$ represented the FOV of the phase encoding, and $G_{sep}$ represented the separation gradient.

10. The apparatus of claim 9, wherein the factor of W comprises decimal.

11. The apparatus of claim 9, wherein the factor $W_f$ comprises a positive number.

12. The apparatus of claim 9, wherein when the factor of W comprises a decimal, $W_f$ is a value of W rounding up.

13. The apparatus of claim 9, wherein the plurality of segments comprise a plurality of slope or a same slope.

14. The apparatus of claim 9, wherein the frequency encoding gradient comprises a plurality of segments.

15. The apparatus of claim 13, wherein the k-space data acquired have a trajectory in a zigzag form.

16. The apparatus of claim 13, wherein the k-space data acquired have a trajectory in a 'V' or inverted 'V' form.

* * * * *